United States Patent [19]

Baker

[11] Patent Number: 4,559,695

[45] Date of Patent: Dec. 24, 1985

[54] METHOD OF MANUFACTURING AN INFRARED RADIATION IMAGING DEVICE

[75] Inventor: Ian M. Baker, Romsey, England

[73] Assignee: U.S. Philips Corporation, New York, N.Y.

[21] Appl. No.: 692,258

[22] Filed: Jan. 17, 1985

Related U.S. Application Data

[62] Division of Ser. No. 355,835, Mar. 8, 1982.

[30] Foreign Application Priority Data

Mar. 27, 1981 [GB] United Kingdom ................ 8109778
Feb. 12, 1982 [GB] United Kingdom ................ 8204158

[51] Int. Cl.[4] ........................................ H01L 31/18
[52] U.S. Cl. .................................... 29/572; 29/576 B;
29/578; 29/591; 148/1.5; 156/643; 156/630;
204/192 E; 250/492.2
[58] Field of Search ...................... 29/572, 576 B, 578,
29/591; 156/643, 630; 204/192 E; 250/492.2;
148/1.5

[56] References Cited

U.S. PATENT DOCUMENTS

| | | | |
|---|---|---|---|
| 4,104,674 | 8/1978 | Lorenze, Jr. et al. | 357/30 |
| 4,128,467 | 12/1978 | Fischer | 204/192 E |
| 4,196,508 | 4/1980 | Lorenze, Jr. | 29/577 R |
| 4,227,942 | 10/1980 | Hall | 136/255 |
| 4,290,844 | 9/1981 | Rotolante et al. | 156/630 |
| 4,291,068 | 9/1981 | Jones et al. | 427/88 |
| 4,301,591 | 11/1981 | Withers | 29/572 |
| 4,312,115 | 1/1982 | Diedrich et al. | 29/572 |
| 4,321,615 | 3/1982 | Blackman et al. | 357/30 |
| 4,411,732 | 10/1983 | Wotherspoon | 156/643 |
| 4,439,912 | 4/1984 | Pollard et al. | 29/572 |
| 4,447,291 | 5/1984 | Schulte | 156/643 |

OTHER PUBLICATIONS

Felix, P. et al. "CCD Readout of Infrared Hybrid Focal-Plane Arrays." *IEEE Transactions on Electron Devices*, vol. Ed-27, No. 1, Jan. 1980, pp. 175-188.

*Primary Examiner*—Aaron Weisstuch
*Attorney, Agent, or Firm*—Marc D. Schechter

[57] ABSTRACT

An array of photovoltaic infrared radiation detector elements are formed in a body of infrared sensitive material, e.g. of cadmium mercury telluride. The body is present on a circuit substrate, which may comprise a silicon CCD for processing signals from the detector elements. An array of regions of a first conductivity type which form the p-n junctions of each detector element with an adjacent body part of opposite conductivity type, extend through the thickness of the body at side-walls of an array of apertures. Each aperture is associated with a detector element and is preferably formed by ion etching. These regions of the first conductivity type are electrically connected to substrate conductors in a simple and reliable manner by a metallization layer in the apertures, without rendering a significant area of the detector insensitive to radiation imaged onto the upper surface of the body. At least the back surface of the detector body (11) has a passivating layer over the area around and between the apertures, to enhance detector element performance. This back surface is secured to the circuit substrate by a layer of electrically insulating adhesive. The main body part is connected to a substrate conductor by a metallization at a surface portion which is outside of the area of the back surface and which is between the apertures. The resulting device is a closely-packed array of high performance detector elements on a circuit substrate. The spacing between adjacent apertures is 100 microns or less.

6 Claims, 6 Drawing Figures

METHOD OF MANUFACTURING AN INFRARED RADIATION IMAGING DEVICE

This is a division, of application Ser. No. 355,835, filed Mar. 8, 1982.

BACKGROUND OF THE INVENTION

This invention relates to infrared radiation imaging devices and methods of manufacturing such imaging devices. The invention also relates to manufacturing detector elements for such imaging devices.

Infrared radiation imaging devices are known comprising infrared radiation detector elements formed in a body of material sensitive to infrared radiation Each imaging device also comprises a substrate, having a major surface on which the body is mounted, and circuit elements for processing signals derived from the detector elements. Each detector element comprises a region of one conductivity type which forms with an adjacent part of the body a p-n junction for detecting charge-carriers generated in the material by the infrared radiation. These regions are electrically connected to the circuit elements via a conductor pattern present at the major surface of the substrate. An example of such an imaging device is disclosed in an article by P. Felix, et al entitled "CCD Readout of Infrared Hybrid Focal-Plane Arrays" (I.E.E.E. Transactions on Electron Devices, Vol. ED-27, No. 1, Jan. 1980 pages 175–188).

As described in this article such a device structure is adopted in order to couple an array of photovoltaic detector elements to signal processing circuitry in the substrate. In a commonly desired form, the substrate comprises a silicon charge-coupled device for time-delay and integration (TDI) processing of the signals from the detector elements. By contrast the detector material may be, for example, indium antimonide, lead tin telluride or cadmium mercury telluride. Depending on whether current coupling or voltage coupling is used, the substrate conductor pattern (to which the detector region is connected) may be doped semiconductor regions in the substrate (for example a diffused input zone of the CCD) or may be conductor layers on an insulating layer on the substrate (for example an insulated gate at the CCD input).

As recognized in the Felix et al article, the principal technological difficulty with such hybrid imaging devices concerns the means for electrically connecting each detector element to the corresponding input of the substrate circuit. It is conventional for the detector body to be secured to the substrate by metallization forming an electrical connection to the body. In the form shown in FIG. 10(a) of the article the detector element regions which are connected to the substrate conductor pattern are restricted to mesas at the surface of the detector body facing the circuit substrate. The p-n junctions formed by these regions terminate at the side walls of the mesas containing the regions. The detector body and the circuit substrate are linked together only by contacts in the form of metallization columns of indium which constitute both the mechanical and electrical interface between the regions of the detector elements and the input of the substrate circuit. Apart from these columns, the detector body is separated from the circuit substrate. The radiation which is to be detected by generating charge carriers at the radiation-sensitive p-n junction may be incident at either the back surface of the silicon CCD substrate or the front surface of the detector body. In the first case significant absorption of the radiation may occur in transmission from the CCD substrate through the thick metallization columns in front of the junction.

Therefore, preferably, the radiation is imaged onto the detector body, but in this case the radiation or at least the charge-carriers generated by the radiation must cross the bulk of the body to reach the junctions contained in the mesas on the far side of the detector body. The carriers are generated through the detector body, and the sensitivity of the junctions depends on diffusion of the carriers through the bulk to the junctions. Since the carriers may recombine before reaching the junction, the sensitivity is impaired. Furthermore, transverse diffusion of the carriers results in cross talk between the detector elements. The presence of the metallization in the areas behind the junction may cause scattering of the radiation and contribute to cross talk between the detector elements. The performance of the detector elements can also be degraded by stress induced in these areas by the detector body being secured to the circuit substrate by the metallization.

Furthermore, it can be difficult to assemble the detector body on the circuit substrate in this way in a reliable manufacturing process, particularly if it is desired to maintain a small well-defined area for the connecting metallization. The mesas of the detector body must be carefully aligned with the metallization columns on the substrate conductor pattern, which is technically difficult in a manufacturing process, particularly for a compact closely spaced array. High temperatures are required to reflow and bond the indium to the detector mesas. Such temperatures can degrade the characteristics of the detector elements. Furthermore, with such an imaging device structure it is necessary to fabricate and test the detector elements before mounting the detector body on the circuit substrate. These are expensive steps, so that after carrying them out it is undesirable to use a connection technique which can significantly reduce the yield of satisfactory detectors. Even in a satisfactory detector it appears that the indium can easily fracture due to thermal stress when cooled during operation.

An alternative device arrangement is illustrated in FIGS. 10(b) and 11 of the Felix et al article in which separate detector bodies for each detector element are used instead of mesas on a thicker common body. These bodies can be thin so that radiation incident on the detector bodies is not significantly absorbed before reaching the junction. However, the bodies are still bonded to the substrate by metallizations forming connections to the detector regions facing the substrate, and so they suffer from some of the attendant disadvantages, such as performance degradation by induced strain and difficulties in achieving compact closely-spaced arrays. Cross talk between detector elements is eliminated by having a separate body for each detector element, but this arrangement requires a separate connection for the other region of each of the detector elements since this other region is no longer common. As illustrated in FIGS. 10(b) and 11, these separate connections need to be insulated from the p-n junctions by an insulating layer on the side walls of the detector bodies and their continuation as a metallization pattern between the detector bodies may result in a significant proportion of the area on which the radiation is incident being insensitive. Furthermore, these detector elements are again fabricated and tested before being mounted on the substrate conductor pattern, and bonding of the bodies to the conductor pattern can degrade the detector characteristics. It is also a time-consuming process to position and align individually a large number of separate detector bodies as an assembled array on the circuit substrate for the bonding operation.

SUMMARY OF THE INVENTION

In a first aspect of the present invention, an infrared radiation imaging device comprises infrared radiation detector elements formed in a body of material sensitive to infrared radiation. The device further comprises a substrate having a major surface, on which the body is mounted and circuit elements for processing signals derived from the detector elements. Each detector element comprises a region of one conductivity type which forms with an adjacent part of the body a p-n junction for detecting charge-carriers generated in the material by the infrared radiation. The regions of the one conductivity type are electrically connected to the circuit elements via a conductor pattern present at the major surface of the substrate.

According to the invention the body is separated from the substrate by a layer of electrically insulating adhesive which secures one major surface of the body to the substrate. A plurality of apertures extend through the thickness of the body and also through the adhesive layer to reach the conductor pattern of the substrate. Each of said apertures is associated with a detector element. The regions of the one conductivity type extend through the thickness of the body at the sidewalls of the apertures and are electrically connected to the conductor pattern of the substrate by a metallization layer in the apertures. The part of the body of the opposite conductivity type has an electrical connection formed by a metallization at a surface portion of the body which is outside of the area of the one major surface between the apertures. A passivating layer is present at the one major surface of the body over the area around and between the apertures.

Such an imaging device structure according to the present invention results in a compact, closely packed array of high performance detector elements connected in advantageous manner to the signal processing circuit elements in the substrate. The substrate-facing surface of the detector element body is secured to the substrate by a layer of electrically insulating adhesive and is passivated over the area between the apertures, which area is also free of the electrical connection to the body part of the opposite conductivity type. The provision of the passivating layer in this area of the substrate-facing surface between the apertures enhances the performance of the detector elements.

The use of an electrically insulating adhesive for securing the body to the substrate and the absence of metallization at this substrate-facing surface area between the apertures permit very close packing of the apertures and their detector elements while simplifying the manufacturing steps necessary for securing and connecting the detector element body on the circuit substrate. They also induce little stress in the detector element body and provide a structure with insignificant radiation scattering between detector elements. The metallization layer forming the electrical connections for the regions of the one conductivity type can be provided in the apertures in a simple and reliable manner without significantly affecting the yield of satisfactory detectors. As will be described hereinafter the detector elements (and particularly the p-n junctions) can be fabricated after mounting the detector body on the substrate. The detector elements may even be tested using circuitry provided in the substrate.

Because the regions of the one conductivity type extend through the body thickness at each aperture associated with a detector element, the radiation to be detected may be incident at the surface of the body remote from the substrate and generate charge carriers easily within reach of the p-n junctions formed by the regions without having to cross a large thickness of the body material, so reducing undesired absorption of the radiation. Because these regions extend through the body thickness at the side walls of the apertures and are connected in these apertures to the substrate conductor pattern, no insulating layer is needed on the side walls to insulate the p-n junctions from the metallization forming these connections.

The array of apertures and their metallization need occupy only a small proportion of the area measured parallel to the surface of the substrate so that structures according to the invention are particularly suitable for forming imaging devices with closely-packed detector element arrays. Thus, for example, the spacing between centers of adjacent apertures in the detector element body can be 100 microns or less, and each of the apertures can be less than 30 microns wide.

Furthermore, as will be described more fully hereinafter, such an imaging device structure according to the invention can be fabricated by advantageous manufacturing processes using ion etching to form the apertures in the body. Thus, only two photolithographic steps may be necessary after securing the body to the substrate, and both the apertures and the side wall regions of the one conductivity type can be formed simultaneously in an ion etching step when the body is of p-type cadmium mercury telluride. Particularly when using ion etching, steep-walled apertures can be formed having a width which is, for example, less than twice the thickness of the body, and the body can be etched in situ on the substrate. However, although ion etching is at present preferred, particularly for cadmium mercury telluride, the array of apertures may be formed in the detector body using other material-removing treatments as appropriate to the particular material chosen for the detector body in any particular case. The contour and steepness of the side walls of the apertures depends on the particular material of the body and depends on the particular material-removing treatment used. If these side walls are not steeply inclined, the metallization layer in the apertures may be restricted to the bottom portion of the side walls of the apertures.

The p-n junction formed by the regions at the side walls of the apertures may form either a part of the or the entire detector element junction. Thus, a particularly simple detector element structure is formed when the whole p-n junction for detecting the radiation-generated charge carriers is provided by the p-n junction formed by the regions at the side walls of the apertures. A photovoltaic detector element with this simple structure has a radiation sensitive area which extends a carrier diffusion length sideways in the adjacent body part beyond the p-n junction, so that in this case the apertures may be spaced apart by approximately two diffusion lengths or less.

However, the regions of the one conductivity type may each have a part which extends along the surface of the body remote from the substrate and forms an area of the p-n junction parallel to the surface. In this case, in order to provide the junction area closer to the surface than to the substrate, the region part which extends along this surface may have a thickness less than half that of the body. However, the detector element body may be sufficiently thin that the junction area is close to the surface even when the region part is more than half the thickness of the body.

Preferably, the body is less than 20 microns thick. Furthermore, in order to reduce the insensitive area formed by the metallization layer in the apertures, the radiation-sensitive area of the detector elements as measured parallel to the major surfaces of the body should preferably be at least ten times as large as this insensitive area as measured parallel to the major surfaces.

According to a second aspect of the present invention, there is provided a method of manufacturing infrared radiation detector elements in a body of infrared radiation sensitive cadmium mercury telluride suitable for an imaging device according to the first aspect of the invention. In the method, the apertures associated with the detector elements are formed by localized ion etching through the thickness of the body. At least a portion of the body has conductivity characteristics of p-type material at the operating temperature of the detector. The ion etching also serves to convert the p-type material adjacent the etched side walls of the apertures into material having conductivity characteristics of n-type material at the detector operating temperature, thereby forming at least a part of the regions of the one conductivity type as n-type material which extends through the thickness of the body at the side walls of the apertures.

It has been found, when ion etching locally through the thickness of a p-type body of cadmium mercury telluride for such an imaging device, that a sufficient sideways (i.e. lateral) conversion of the conductivity type occurs at the etched side walls of the apertures to form an n-type region of acceptable quality around the side walls. This surprising sideways conductivity-type conversion feature permits n-type regions adjoining the upper major surface of the body, and forming the carrier-detection junctions of the detector elements, to be extended in a simple but reliable manner into the ion etched apertures and through the body thickness for connection to the substrate conductor pattern.

Even more surprisingly, the annular p-n junction formed around these apertures by the conductivity type converted material is of sufficiently good quality to provide the entire actual detector element junction. This permits the detector elements to have a particularly simple structure and to be made in a reliable manner with very few manufacturing steps. It has been found that such simple detector element structures manufactured in this way can have a particularly high diode resistance and hence a high detectivity.

However, it is not necessary for the junction-forming region of detector elements of an imaging device according to the invention to be formed by this ion etching conversion process. Thus, dopant diffusion or ion implantation may be used to form the regions adjacent the side walls of the apertures.

Preferably, a method according to the third aspect of the invention may be used. In this method after securing the body of infrared radiation sensitive material to the substrate by the layer of electrically insulating adhesive, one photolithographic step is used to provide on the body surface a masking layer having windows located above parts of the conductor pattern below the body. The apertures are formed using localized ion etching through the thickness of the body at the windows. The metallization layer is provided in the apertures by depositing metal on the masking layer and on exposed parts of the conductor pattern at the apertures, and then removing the masking layer to leave the metallization layer in the apertures. Another photolithographic step is used to determine the area of the peripheral portion of the body at which electrical connection is made to the part of the body of the opposite conductivity type.

Such a method according to with the third aspect of the invention provides a reliable manner for confining the metallization layer connection within the apertures, as well as reducing the number of process steps involving photolithography. Although additional photolithographic steps may be used to fabricate the detector element structure (for example when the detector elements include a junction-forming region parallel to the major surface), only these two photolithographic steps are necessary for fabricating the detector elements and their connections when the junction-forming regions of the detector elements simply extend adjacent the side walls of the apertures and are formed by a doping treatment, or any other conductivity-type conversion treatment (including ion etching) at the side walls of the apertures as defined by the windows of the masking layer. Furthermore, the extent of the metallization forming the connection to the opposite conductivity type part of the body can be defined by depositing metal on a second masking layer and exposed body part which are photolithographically defined in the other photolithographic step, and then removing this second masking layer to leave the metallization connection at the peripheral portion of the body.

DESCRIPTION OF THE PREFERRED EMBODIMENTS

Figure 1:
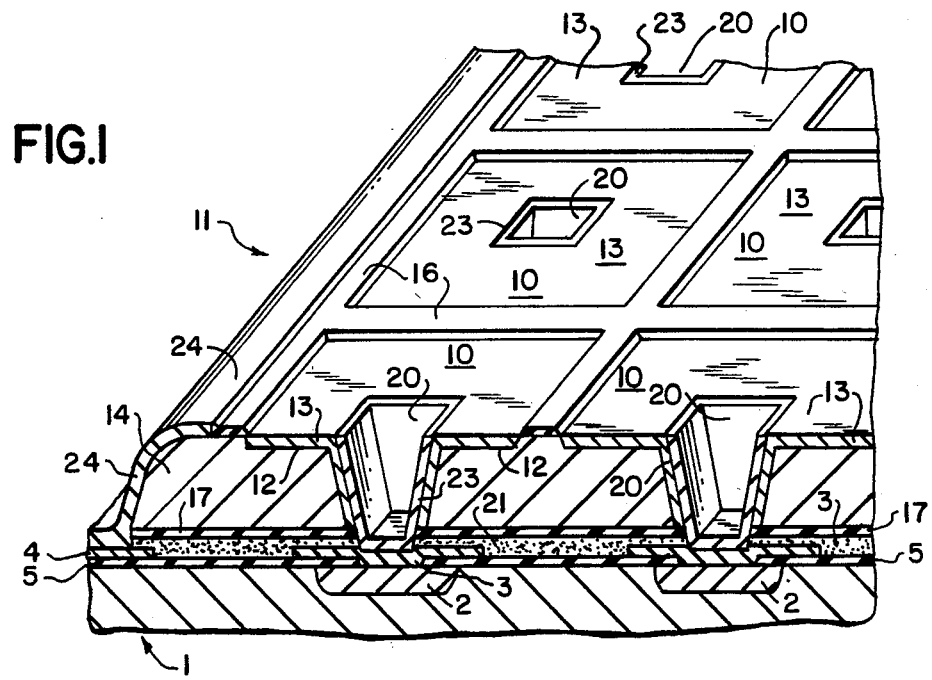
FIG. 1 is a partly cross-sectional, partly perspective view of a part of an imaging device according to a first aspect of the invention.

It should be noted that all the Figures are only schematic and are not drawn to scale. The thicknesses of the cross-sections of some parts of the drawing have been strongly exaggerated both for clarity and convenience in the drawing.

The infrared radiation imaging device illustrated in FIG. 1 comprises a monolithic circuit substrate 1 having a conductor pattern 2 and 3. An array of photovoltaic infrared radiation detector elements 10 is formed in a body 11 of infrared radiation sensitive material. A substrate 1 has a major surface on which the body 11 is mounted and comprises circuit elements for processing signals derived from the detector elements 10.

Each detector element 10 comprises a region 13 of one conductivity type which forms with an adjacent part 14 of the body 11 a p-n junction 12 for detecting charge carriers generated in the material by the infrared radiation. The regions 13 are electrically connected to the circuit elements via the conductor pattern 2 and 3 present at the major surface of the substrate 1.

According to the present invention, the body 11 is separated from the substrate 1 by a layer 21 of electrically insulating adhesive which secures one major surface of the body 11 to the substrate 1. A plurality of apertures 20 extend through the thickness of the body 11 and also through the adhesive layer 21 to reach the conductor pattern 2 and 3 of the substrate 1. Each of the apertures 20 is associated with a detector element 10.

The regions 13 extend through the thickness of the body 11 at the side walls of the apertures 20 and are electrically connected to the conductor pattern 2 and 3 of the substrate 1 by a metallization layer 23 in the apertures 20. The part 14 of the body 11 of the opposite conductivity type is connected to the conductor pattern 2 and 3 of the substrate 1 by metallization 24 at a surface portion of the body 11 which is outside of the area of the one major surface between the apertures 20. A passivating layer 17 is present at the one major surface of the body 11 over the area around and between the apertures 20.

The substrate 1 may comprise any form of read out circuitry for processing the signals derived from the detector elements 10, for example involving multiplexing, amplification, correlation, and/or time-delay and integration. Such circuitry may include, for example insulated-gate field effect transistors and/or charge transfer devices such as a charge coupled device (CCD). The bulk material of the substrate is preferably, for example, monocrystalline silicon, since such circuitry can readily be formed using known silicon integrated circuit techniques. However, any other convenient semiconductor material may be used for the substrate 1. So as to reduce absorption and generation of charge carriers in the substrate 1 by infrared radiation (which will usually be imaged onto the body surface remote from the substrate 1), the semiconductor material of the substrate 1 preferably has a wider band gap than the detector material of the body 11.

Depending on the particular circuitry in the substrate 1 and whether current coupling or voltage coupling is used, the substrate conductor pattern to which the regions 13 are connected may be an array of doped regions (such as region 2) in the substrate, an array of metal layer electrodes (such as electrode 3) at a window in an insulating layer, (for example the insulating layer 5) on the substrate surface, or an array of conductor layers (for example an insulated gate of a transistor or of a CCD) on an insulating layer 5 on the substrate 1. Furthermore, as is already known for complex silicon integrated circuits, the substrate conductor pattern may comprise more than one level of metallization extending on and at windows in more than one insulating layer on the substrate surface, the upper metallization level forming an array of contact areas for the detector element metallizations 23 and 24. By way of example, FIG. 1 shows both a doped region 2 and its electrode 3 which form for example the source of an insulated gate transistor or the input of a CCD. Other details of the signal-processing circuitry of the substrate 1 are not shown in the drawing, as they may be of known type and are not important for understanding the present invention.

The material of the detector body 11 may be for, example, indium antimonide or a suitable ternary chalcogenide compound such as lead tin telluride or cadmium mercury telluride. Preferably the body 11 is of cadmium mercury telluride since particularly advantageous detector characteristics can be obtained with such material, its thermal expansion coefficient is close to that of silicon, and as described hereinafter a particularly advantageous manufacturing process may be used. Thus, the body 11 may be of cadmium mercury telluride, the bulk of which has p-type conductivity characteristics at the detector operating temperature, and the composition of which is suitable for detecting infrared radiation in the 8 to 14 micron wavelength band or, for example, in the 3 to 5 micrometer wavelength band. Thus, in this case the regions 13 have n-type conductivity.

Charge carrier pairs generated by incident radiation in the radiation-sensitive area within a diffusion length of the p-n junction 12 are collected by the p-n junction. These carriers are separated by the electric field at the p-n junction 12 and produce an output signal which is applied to the substrate conductor pattern 2 and 3 via connections 23. In the FIG. 1 arrangement the main area of the p-n junction 12 of each detector element is formed by surface parts of the regions 13 which extend along the surface of the body 11 remote from the substrate 1 and which have thicknesses less than half that of the body, so that these areas of the junction 12 are closer to the body surface than to the substrate 1. The metallization 23 which connects the regions 13 to the substrate conductor pattern 2 and 3 contacts the whole of the side walls of the apertures 20 in the FIG. 1 arrangement, but does not extend significantly over the upper edge of the apertures 20 onto the body surface. However, if desired, the metallization 23 may extend slightly onto this surface around each aperture 20.

In FIG. 1, the opposite conductivity type part 14 of body 11 is shown connected by metallization 24 to a conductor layer 4 (for example of metal) on the insulating layer 5 of the substrate 1. Thus, the conductor layer 4 and metallization 24 provide a single common connection to the regions 14 of the detector elements 10. This metallization 24 may contact the regions 14 around all of the outer side walls of the body 11. Only a part of one outer side wall is shown in FIG. 1. However, if desired, the connection to the region 14 may be formed in other ways, for example at one or more apertures in the body 11.

A grid of passivating, insulating material 16 is present on the body 11 where the region 14 adjoins the surface between juxtaposed regions 13 of adjacent detector elements 10. In this case, each detector element 10 is present at an opening of the grid 16. When the body 11 is of cadmium mercury telluride, the grid 16 may be of, for example, an anodic oxide or zinc sulphide. However, instead of a grid 16, a layer of zinc sulphide having contact windows for the metallizations 23 and 24 may be present over the whole body surface remote from the substrate 1. A similar passivating, insulating layer 17 is present on the surface of the body 11 which faces the substrate 1 and which is bonded to the substrate 1 by the adhesive layer 21. This layer 17 also passivates the whole edge termination of the p-n junction 12 at this surface.

Figure 2:
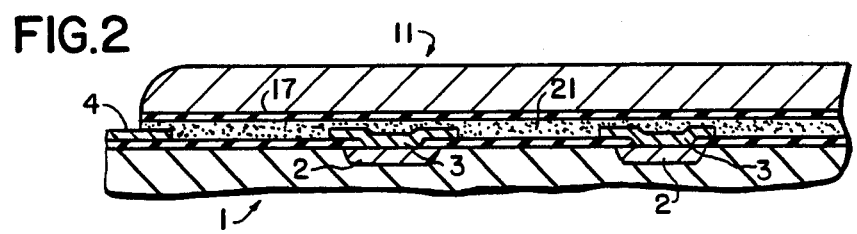
FIGS. 2 to 5 are cross-sectional views of part of a detector body mounted on a circuit substrate at various stages in the manufacture of such an imaging device by a method according to the second and third aspects of the invention.

One advantageous method of manufacturing the device of FIG. 1 will now be described with reference to FIGS. 2 to 5. Firstly, the signal-processing circuit is formed in a known manner in and on the substrate 1. A body 11 consisting wholly of p-type cadmium mercury telluride is provided on its back surface with the passivating layer 17. A thin film of adhesive 21 is then provided on the substrate 1 over the area of the insulating layer 5 and its conductors 3 and 4 where the body 11 is to be bonded. The body 11 is then provided on the adhesive film with the outer side walls of the body 11 positioned over the conductor 4. After curing the adhesive the structure illustrated in FIG. 2 is obtained.

A passivating layer (from which the grid 16 is subsequently to be formed) is then provided over the body 11. Using conventional photolithographic techniques a grid-shaped photoresist pattern 36 is formed on this passivating layer. The photoresist pattern 36 has a shape corresponding to that of the desired grid 16 except that the outer part of the pattern 36 also extends over the outer side walls of the body 11. The photoresist pattern 36 is then used as a mask both during an etching step to remove the exposed areas of the passivating layer where the detector elements 10 are to be formed (FIG. 3) and during a doping step to form part of the n-type regions 13 of these detector elements.

These etching and doping steps may be performed using different techniques. Thus, for example, the exposed passivating areas may be removed using a chemical etchant solution or, for example by ion etching. The n-type regions may be formed by implanting donor dopant ions. Thus the arrows 33 of FIG. 3 may be illustrative of either the ion etching step or the ion implantation step. However, ion etching may also be used to form n-type regions in p-type cadmium mercury telluride as described in U.S. Pat. No. 4,411,732, the contents of which are hereby incorporated by reference. Thus the arrows 33 may represent ions (for example, argon ions) with which the body 11 is bombarded both to etch away the unmasked passivating layer areas and to etch away a sufficient surface-adjacent part of the resultingly exposed p-type cadmium mercury telluride to form n-type regions to the desired depth for the p-n junction 12.

Figure 3:
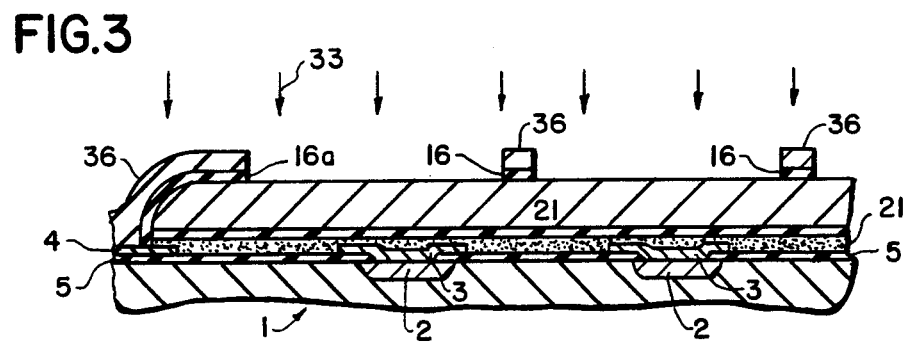

The remaining parts of the passivating layer form the grid 16 which has an extended part 16a over the outer side walls of the body 11, as illustrated in FIG. 3. The resulting n-type surface regions 13a form an array, each region 13a being bounded by the passivating grid pattern 16 and 16a, as illustrated in FIG. 4.

Figure 4:
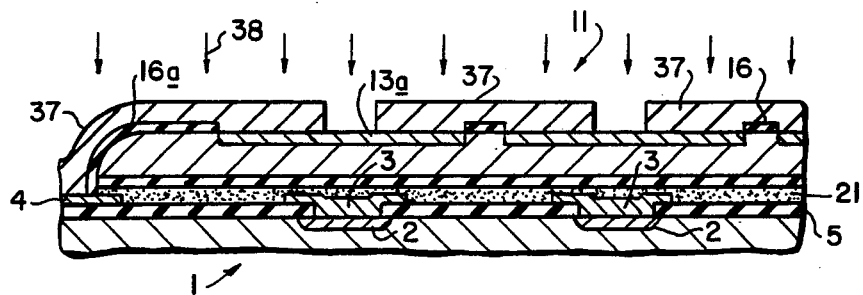

A further stage of manufacture is illustrated in FIG. 4 in which the body 11 and substrate 1 have further mask 37 of photoresist provided thereon. Mask 37 is provided after the removal of the photoresist pattern 36. The mask 37 has an array of windows each of which is located over an area where an aperture 20 is to be formed.

Figure 5:
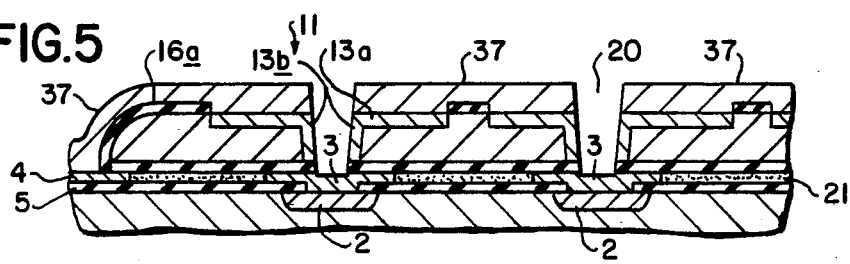

Since the body 11 is of cadmium mercury telluride the apertures 20 are preferably formed by etching with an ion beam 38, for example of argon ions. The dose, energy, and mass of the bombarding ions 38 can be chosen such that a sufficient excess concentration of mercury is produced from the etched-away parts of the body 11 as to act as a diffusion source for converting the p-type body parts adjacent the side walls of the resulting apertures 20 into n-type side wall regions 13b which form the parts of the regions 13 which extend through the thickness of the body 11 at the apertures 20. The resulting structure is illustrated in FIG. 5.

The formation of the apertures 20 by such an ion etching process permits not only the simultaneous formation of the side wall regions 13b, but also produces steep side walls with at most only small lateral etching occurring below the edge of the photoresist mask 37. A typical slope for these steep side walls is for example 75° so that narrow apertures 20 can be formed through the thickness of the body 11 in this way. The apertures 20 may thus have a width which is less than twice the thickness of the body 11 and may even be less than the thickness of the body 11.

The photoresist pattern 37 also serves as a mask during the removal of the adhesive from the surface of the conductors 3 at the apertures 20. After exposing the conductors 3, metallization layer 23 (for example chromium-gold) is deposited in the apertures 20 to connect the n-type side wall regions 13b to the conductor pattern 2 and 3. Preferably, this metallization is deposited over the whole upper surface of the FIG. 5 structure before removing the photoresist mask 37. Then, when the mask 37 is subsequently removed the metallization 23 remains on the exposed side walls of the apertures 20 and on the exposed conductors 3 where it was deposited through the windows of the mask 37. The metallization which was deposited on the mask 37 is removed with the mask 37. In this manner the remaining metallization 23 is self-aligned with the apertures 20.

Subsequently, using known photolithographic and chemical etching techniques, a photoresist masking layer is provided on the body 11 except adjacent its outer periphery. The extra part 16a of the passivating grid 16 is then removed where it extends over the outer side walls of the body 11. Metallization is deposited on the masking layer and on the exposed periphery of the body 11, after which the masking layer is removed to leave the metallization 24 which connects the p-type bulk of the body 11 to the substrate conductor 4. The final detector structure is illustrated in FIG. 1.

Some typical dimensions for one specific example of an imaging device manufactured in this way with a conventional silicon CCD substrate 1 are as follows:

The cadmium mercury telluride body 11 is 1.4 millimeters by 1.4 millimeters by 10 microns for an array of, for example, 32×32 photovoltaic detector elements. The adhesive layer 21, the passivating grid 16, and the passivating layer 17 are 1 micron thick. The n-type surface regions 13a are 3 microns thick. The portions of the grid 16 between the n-type surface regions 13a; are 7 microns wide. Each (square) opening of the grid 16 associated with a separate detector element 10; is 40 microns by 40 microns. Each (approximately square) aperture 20 as measured at the body surface remote from the substrate 1 is 10 microns by 10 microns. The n-type side wall regions 13b and the metallization 23 are 3 and 0.6 microns respectively.

As measured parallel to the upper body surface on which the infrared radiation is imaged, the total resulting area which is occupied by the apertures 20 and metallization 23 (and so is insensitive to the radiation) is only approximately 5% of the whole area of the body surface. Thus, a closely packed array of detector elements having a large active area is obtained, in spite of the separate connections between the regions 13 of the detector elements and the conductors 3 of the signal processing substrate 1.

It will be evident that many modifications are possible within the scope of the present invention. Thus, for example, depending on the form of the substrate circuitry, the substrate conductor pattern to which the n-type regions 13 are connected may even in some cases include the part of the metallization 23 on the area of the substrate 1 at the bottom of the apertures 20. In this case, this bottom part of the metallization 23 is connected to the regions 13 by the part of the metallization 23 on the side walls of the apertures 20.

Figure 6:
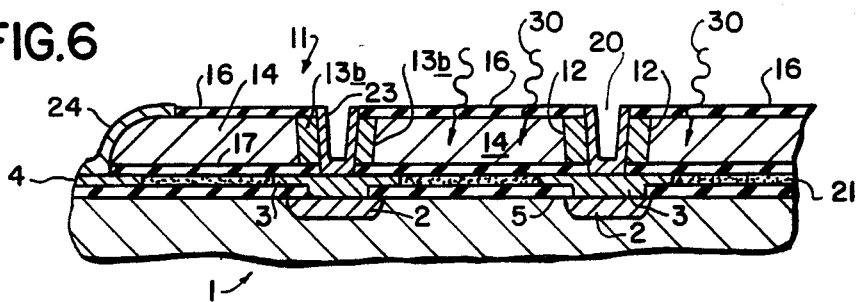
FIG. 6 is a cross-sectional view of part of another imaging device according a the first aspect of the invention.

It is not necessary for part of the p-n junction 12 to extend parallel to the major surface of the detector body 11. Thus, for example, FIG. 6 illustrates a modification of the FIG. 1 structure, in which the whole of the p-n junction 12 is formed between the n-type side wall regions 13b and the p-type adjoining body part 14. Since in this case the area of the junction 12 is small, the resistance of the photovoltaic diode is high. This considerably improves the signal injection efficiency into the substrate circuit. Electrons generated in the p-type body part 14 by the incident radiation 30 diffuse laterally to the nearest junction 12 so that the sensitive area of each detector element is related to the electron diffusion length in the body part 14. This diffusion length is approximately 30 to 50 microns in p-type cadmium mercury telluride having an acceptor concentration of $10^{17}$ atoms per $cm^3$. The distance between apertures 20 may be, for example, 50 microns in this case.

The FIG. 6 structure permits the construction of a very compact closely spaced photovoltaic detector array. Compared with the FIG. 1 device, both the same and similar portions of the device of FIG. 6 are indicated by the same reference numerals in FIG. 6 as in FIG. 1. The device of FIG. 6 can be manufactured using the same techniques as described with reference to FIGS. 1 to 5, except that the mask 36, the associated etching of the passivating layer and the formation of region parts 13a are omitted. Instead, a mask like the mask 37 of FIG. 4 is used to define the passivating layer grid 16 as well as the apertures 20, the regions 13b, and the metallization 23.

Although the apertures 20 are illustrated in FIG. 1 as being substantially square, the corners produced by ion etching are usually considerably rounded. It should be understood that apertures 20 can have any convenient shape, either straight-sided or curved. Thus, the apertures 20 may be circular, for example. Furthermore, although embodiments having n-type regions 13 in p-type body parts 14 have been described, the regions 13 may be p-type and formed in an n-type body 11 by, for example, acceptor diffusion or implantation.

Although in the imaging devices of FIGS. 1 and 6 the metallization connection 24 only contacts the body 11 around its periphery, it is also possible in the case of the simple detector element structure of FIG. 6 for the metallization 24 to be in the form of a metal grid having a pattern similar to that of the photoresist mask 36 of FIG. 3. Thus, in the FIG. 6 device the metallization 24 may additionally contact the body part 14 over a narrow width between the apertures 20. The provision of such a narrow metal grid 24 is useful for reducing the series resistance in the common connection to the body part 14 and may also define individual optical windows for each detector element 10.

I claim:

1. A method of manufacturing an infrared radiation imaging device, said method comprising the steps of:
   providing a body of infrared-sensitive material having first and second opposite surfaces, said body having p-type conductivity at the operating temperature of the device; and
   ion etching the body to form apertures having side walls extending from the first surface to the second surface of the body, and to convert the p-type material adjacent to the etched side walls into material having n-type conductivity at the operating temperature of the device.

2. A method as claimed in claim 1, characterized in that the method further comprises the steps of:
   providing a substrate having a major surface;
   providing a conductor pattern at the major surface of the substrate; and
   securing the first surface of the body to the substrate with a layer of electrically insulating adhesive before ion etching the body.

3. A method as claimed in claim 2, characterized in that the method further comprises the steps of:
   providing a mask on the second surface of the body, said mask having windows located above the conductor pattern, before ion etching the body;
   ion-etching the layer of electrically insulating adhesive to form apertures therein, said apertures being below the apertures in the body;
   providing a metallization layer in the apertures after ion etching the body, said metallization contacting the n-type material and the conductor pattern;
   removing the masking layer after providing the metallization layer in the apertures; and then
   providing a mask on the second surface of the body, said mask having windows located above surface portions of the body having p-type conductivity.

4. A method as claimed in claim 1, characterized in that:
   the n-type material extends from the first surface of the body to the second surface; and
   the method further comprises the step of providing a metallization layer on the n-type material in the aperture.

5. A method as claimed in claim 1, characterized in that the infrared-sensitive body has a thickness, and the apertures have widths which are less than twice the thickness of the body.

6. A method as claimed in claim 1, characterized in that the method further comprises the step of converting islands of p-type material adjacent to the second surface of the body into n-type material, said n-type material adjoining n-type material at the side walls of apertures.

* * * * *